United States Patent [19]

Mehl

[11] Patent Number: 5,045,734

[45] Date of Patent: Sep. 3, 1991

[54] HIGH POWER SWITCH

[75] Inventor: Byron R. Mehl, Belvidere, Ill.

[73] Assignee: Sundstrand Corporation, Rockford, Ill.

[21] Appl. No.: 535,321

[22] Filed: Jun. 8, 1990

[51] Int. Cl.$^5$ ............... H03K 17/10; H03K 17/08; H03K 17/56; H03K 17/687
[52] U.S. Cl. ................... 307/570; 307/270; 307/446; 307/544
[58] Field of Search ........... 307/270, 446, 448, 570, 307/571, 544

[56] References Cited

U.S. PATENT DOCUMENTS

| | | | |
|---|---|---|---|
| 4,438,356 | 3/1984 | Fleischer | 307/571 |
| 4,488,068 | 12/1984 | Janutka | 307/570 |
| 4,538,076 | 8/1985 | Shimada | 307/315 |
| 4,539,492 | 9/1985 | Michel et al. | 307/270 |
| 4,701,635 | 10/1987 | Kawazoe et al. | 307/270 |
| 4,721,867 | 1/1988 | Header, Jr. et al. | 307/270 |
| 4,845,386 | 7/1989 | Ueno | 307/570 |
| 4,897,566 | 1/1990 | Kitora et al. | 307/270 |
| 4,947,055 | 8/1990 | Slekhawat et al. | 307/270 |

FOREIGN PATENT DOCUMENTS

| | | | |
|---|---|---|---|
| 57-188133 | 11/1982 | Japan . | |
| 61-53638 | 8/1985 | Japan | 307/270 |
| 2130831 | 4/1984 | United Kingdom | 307/296.1 |

Primary Examiner—Stanley D. Miller
Assistant Examiner—Scott A. Ouellete
Attorney, Agent, or Firm—Marshall, O'Toole, Gerstein, Murray & Bicknell

[57] ABSTRACT

A power switch responsive to drive signals developed by a signal source includes driver and driven transistors connected in a Darlington configuration and a further transistor having a control electrode and first and second main current path electrodes wherein the first main current path electrode of the further transistor is coupled to first main current path electrodes of the driver and driven transistors, the second main current path electrode ofo the further transistor is coupled to a control electrode of one of the driver and driven transistors and the control electrode of the further transistor receives the drive signals. The power switch is maintained in a saturated state over a wide range of load current magnitudes.

4 Claims, 3 Drawing Sheets

HIGH POWER SWITCH

Technical Field

The present invention relates generally to switching devices, and more particularly to a high power switch for use in a power converter.

BACKGROUND ART

Power converters typically include power switches in the form of power transistors that are connected in a Darlington configuration and rapidly switched on and off. Usually, these transistors are driven into saturation so that the voltage across the main current path electrodes thereof is maintained at a low level. This, in turn, minimizes the amount of power dissipated by the transistors. However, when the load current conducted by the transistors increases beyond a certain magnitude, as determined by the transistor base current, the transistors are pulled out of saturation resulting in a relatively high level of power dissipation. In extreme circumstances, the transistors can experience thermal runaway, leading to destruction thereof.

One type of circuit which avoids the foregoing difficulty is known as a proportional base drive circuit wherein a transformer is connected between the collector of an output transistor and a base drive circuit connected to a base of the transistor. The base drive circuit adjusts the magnitude of base current supplied to the output transformer to maintain the transistor in saturation. Such a base drive circuit is disclosed in Shuey, et al., U.S. Pat. No. 4,453,089.

One disadvantage of the proportional base drive circuit is the need for the transformer which unduly increases the size and weight of the overall circuit. This can, in turn, render the overall power converter unsuitable for certain applications, such as in aircraft, where size and weight must be kept to minimum levels.

Japanese patent provisional publication no. 57-188133 discloses a transistor relay circuit including a main transistor, a driver transistor coupled to the main transistor in a Darlington configuration and an NMOS transistor having a drain electrode coupled to the collector electrodes of the driver and main transistor and a source electrode coupled to the base of the driver transistor. Drive signals are provided directly to a gate electrode of the NMOS transistors and to the base of the main transistor via a base resistance. During normal operation when main transistor collector current is at or below a certain magnitude, sufficient base current is supplied to the main transistor to maintain it in a saturated condition. The driver and NMOS transistor are off at this time. When the current flowing through the collector and emitter of the main transistor rises above the certain magnitude during peak current conditions, the main transistor pulls slightly out of saturation, in turn applying enough voltage to the NMOS transistor and the driver transistor so that they turn on. These transistors then supply sufficient additional current to the main transistor base to cause the voltage across the collector and emitter of the main transistor to be reduced. This circuit, therefore, limits base drive current during normal or steady state operating conditions yet provides the capability for additional base drive during peak conditions.

When the circuit disclosed in the Japanese publication referred to above is used to operate a large main transistor, the base drive power required to turn on the main transistor is excessive due to the presence of the base resistor and the fact that the driver transistor is not utilized under normal conditions. In addition, since the driver transistor is not normally conducting load current, the main transistor may be driven into hard saturation when lightly loaded. This results in long storage times when the main transistor is turned off leading to delays that adversely affect the function of the circuit.

Ickes, et al., U.S. Pat. No. 4,055,794 discloses a circuit for regulating the base drive voltage of an output transistor. The voltage across the collector and emitter of the output transistor is detected and a signal representative thereof is compared by a comparator against a reference. The comparator in turn controls a base drive circuit coupled to the driver transistor base whereby the output transistor is operated just at saturation.

Patents disclosing Darlington-connected transistors and biasing or drive circuitry for such transistors include Ullman, U.S. Pat No. 3,210,561, Nawa, et al., U.S. Pat. No. 4,138,690, Tani, U.S. Pat. No. 4,769,560 and Shekhawat, et al., U.S. Pat. No. 4,725,741, assigned to the assignee of the present application.

SUMMARY OF THE INVENTION

In accordance with the present invention, a power switch is operated to prevent excessive power dissipation therein.

More particularly, a power switch is responsive to drive signals developed by a signal source and includes driver and driven transistors connected in a Darlington configuration each having a control electrode and first and second main current path electrodes wherein the first main current path electrodes of such transistors are coupled together, the control electrode of the driven transistor is coupled to the second main current path electrode of the driver transistor and the control electrode of the driver transistor is coupled to the signal source and receives the drive signals. A further transistor includes a control electrode and first and second main current path electrodes wherein the first main current path electrode of the further transistor is coupled to the first main current path electrodes of the driver and driven transistors, the second main current path electrode of the further transistor is coupled to the control electrode of one of the driver and driven transistors and the control electrode of the further transistor receives the drive signals.

In the preferred embodiment, the further transistor comprises a MOSFET which conducts current only when the current flowing through the main current path electrodes of the driver and driven transistors exceeds a level where the signal source cannot maintain saturation of the driver and driven transistors.

The power switch of the present invention does not require costly current sensors and operates the driver and driven transistors so that they dissipate a minimum level of power.

DESCRIPTION OF THE PREFERRED EMBODIMENTS

Figure 1:
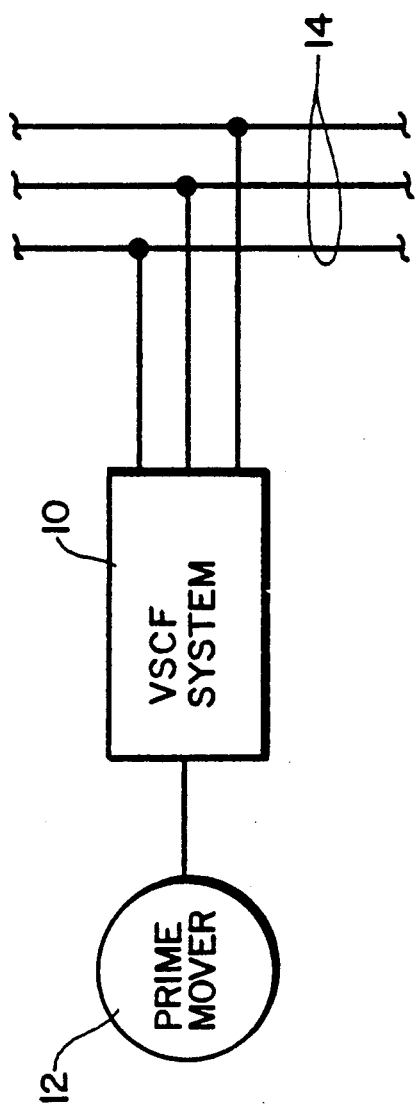
FIG. 1 is a block diagram of a power conversion system incorporating the power switch of the present invention.

Referring now to FIG. 1, there is illustrated a variable-speed, constant-frequency (VSCF) power conversion system 10 which converts variable-speed motive power produced by a prime mover 12 into constant-frequency AC electrical power that is supplied via contactors (not shown) to a load bus 14. As noted in greater detail hereinafter, the VSCF system 10 includes one or more power switches according to the present invention.

As should be evident, the power switch of the present invention is not limited to use with VSCF systems, but may alternatively be used in any other type of power converter or switching device, as desired.

Figure 2:
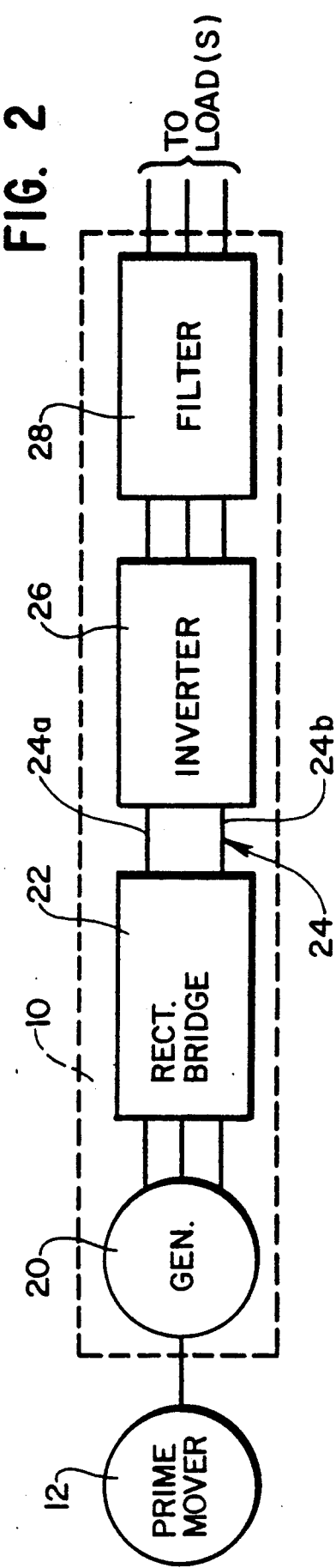
FIG. 2 is a more specific block diagram of the power conversion system of FIG. 1.

Referring to FIG. 2, the VSCF system 10 includes a brushless, synchronous generator 20 which is coupled to the prime mover 12. The generator 20 produces variable-frequency AC electrical power that is in turn converted into DC power by a rectifier bridge 22 on a DC link 24 comprising first and second DC link conductors 24a, 24b. A static inverter 26 receives the DC power on the DC link conductors 24a, 24b and converts the DC power into constant-frequency AC power which is filtered by a filter 28 and supplied to the load bus 14.

Figure 3:
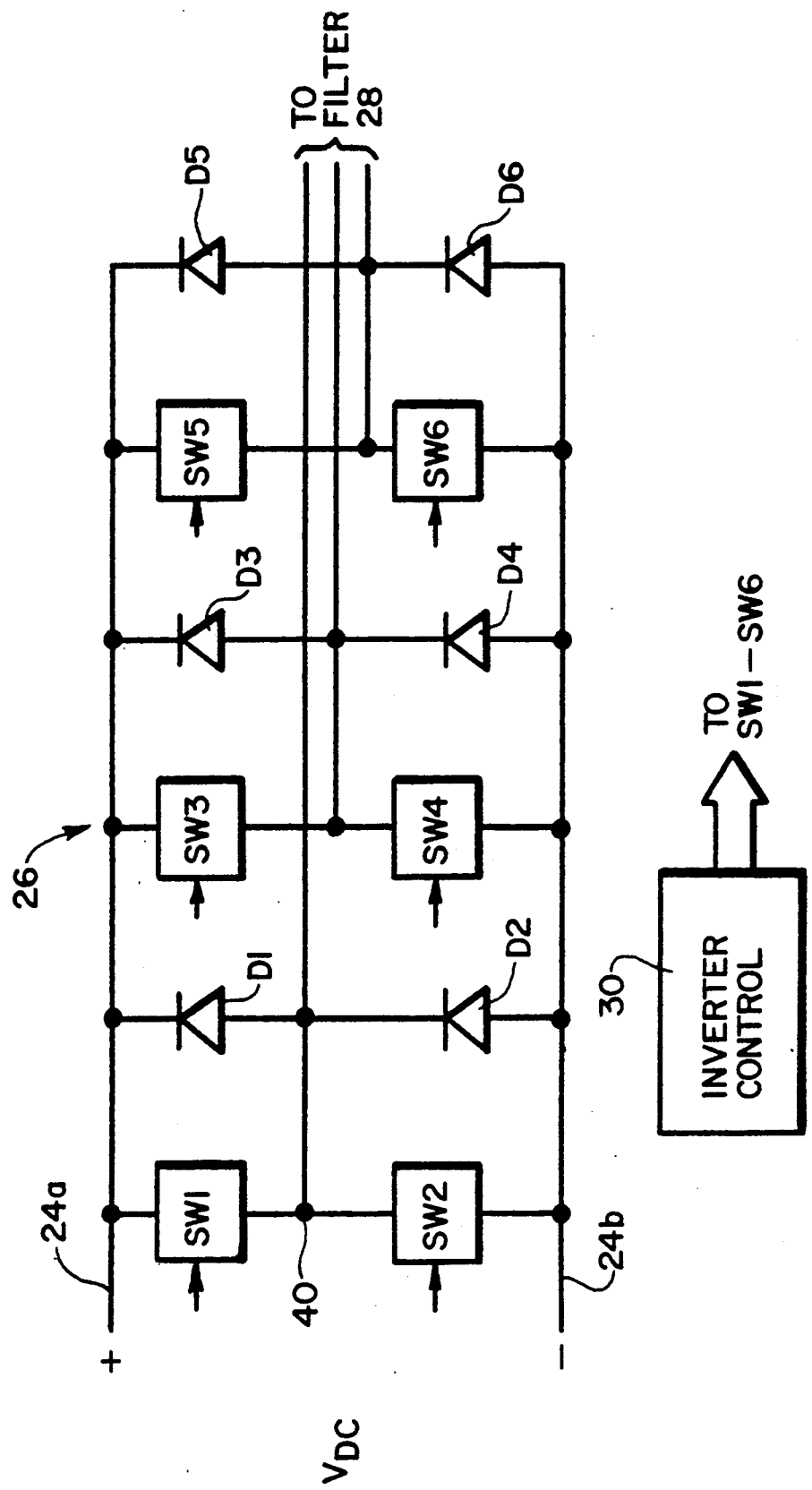
FIG. 3 comprises a simplified combined block and schematic diagram of the inverter of FIG. 2.

FIG. 3 illustrates the inverter 26 in greater detail. It should be noted that various circuits such as a DC link filter, snubber circuits and other auxiliary inverter circuits not important to an understanding of the present invention are not shown in FIG. 3 for the sake of clarity. The inverter 26 includes first through sixth power switches SW1-SW6 that are interconnected in a conventional, three-phase bridge configuration together with associated anti-parallel diodes D1-D6. The switches SW1-SW6 are operated by an inverter control 30 which is in turn responsive to one or more operating parameters of the inverter 26. The inverter control 30 forms no part of the present invention, and hence will not be described in greater detail herein.

Figure 4:
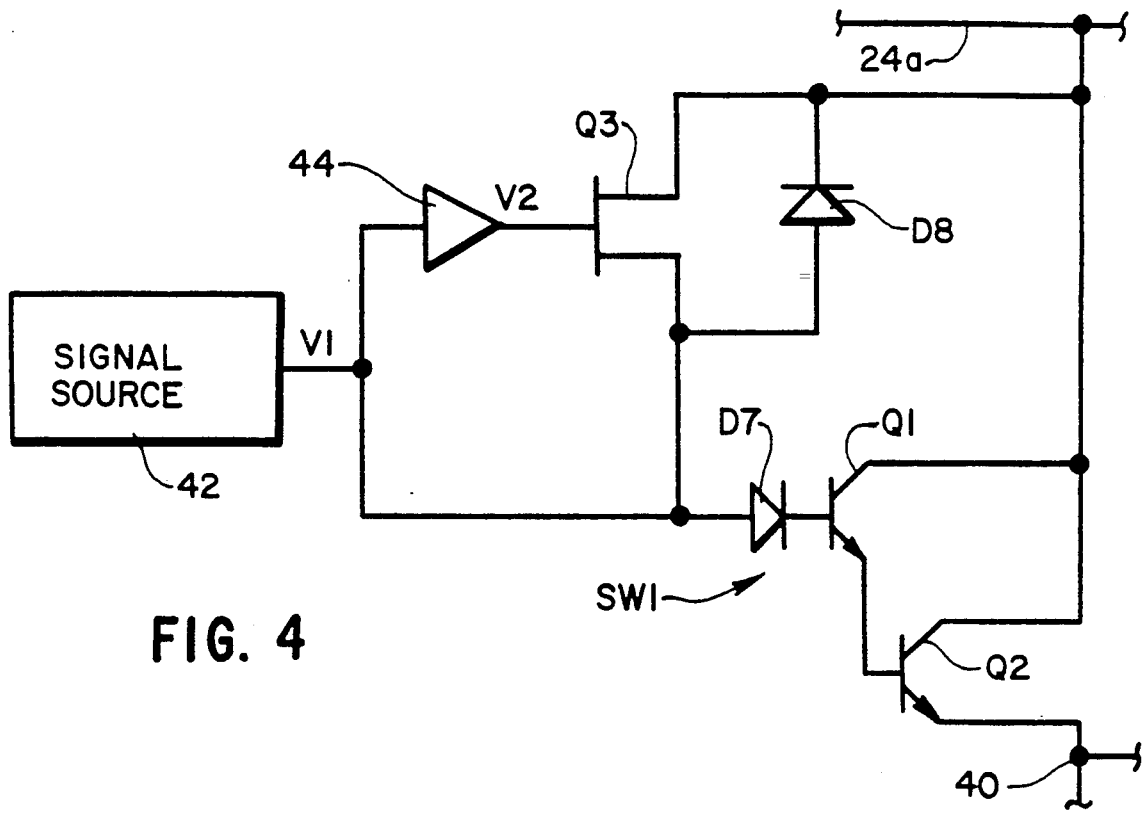
FIG. 4 comprises a combined block and schematic diagram of a first embodiment of the power switch according to the present invention.

Referring now to FIG. 4, a first embodiment of one of the inverter switches, for example the switch SW1, is illustrated in greater detail. The switch includes driver and driven transistors Q1, Q2 which are connected in a Darlington configuration. More particularly, each transistor Q1, Q2 includes main current path or collector and emitter electrodes and a control or base electrode wherein the collector electrodes are connected together and are coupled to the DC link conductor 24a and wherein the emitter of the driver transistor Q1 is coupled to the base electrode of the driven transistor Q2. The emitter electrode of the driven transistor Q2 is coupled to a phase output 40. Load current is conducted from the DC link conductor 24a through the collectors and emitters of the transistors Q1, Q2 to the phase output 40 when the transistors Q1, Q2 are gated into conduction.

A further transistor Q3, which is preferably a MOSFET, includes main current path or source and drain electrodes and a control or gate electrode wherein the drain electrode is coupled to the collectors of the transistors Q1 and Q2 and the source electrode is coupled through a diode D7 to the base electrode of the transistor Q1. A further anti-parallel diode D8 may be coupled across the source and drain electrode of the transistor Q3 and prevents the transistors Q1 and Q2 from being driven into hard saturation when lightly loaded.

If necessary or desirable, the diode D8 may be dispensed with and the intrinsic diode between the source and drain electrodes of the transistor Q3 may instead be used to prevent driving the transistors Q1 and Q2 into hard saturation when lightly loaded.

A signal source 42, which is a part of the inverter control 30, develops drive signals which are coupled directly to the base of the driver transistor Q1 via the diode D7. Further, the drive signals are level-shifted by a level shifter 44 and the level-shifted drive signals are applied to the gate electrode of the transistor Q3.

During operation of the power switch of FIG. 4, a high-state drive signal produced by the signal source 42 is level-shifted and provided to the gate electrode of the transistor Q3. In addition, the high-state drive signal is provided to the base of the transistor Q1 so that both transistors Q1 and Q2 are turned on. The current delivered to the transistors Q1, Q2 by the signal source 42 is adjusted such that both transistors are driven just into saturation under most expected operating conditions. Under such operating conditions, the transistor Q3 does not conduct current. However, if the load current increases beyond a certain level, the voltage across the transistors Q1 and Q2 rises. At such time, the transistor Q3 operates as a linear resistor and conducts increasing current as the drop across the transistors Q1 and Q2 increases. This current is delivered to the base of the driver transistor Q1 so that the transistors Q1 and Q2 are driven back into saturation.

In order to turn the transistor Q3 on, the voltage applied to the gate electrode thereof must be higher than the voltage supplied to the diode D7 by a certain amount. The level shifter 44 provides this increased voltage to permit such turn-on. A similar function could be provided by increasing the voltage level of drive signals provided by the signal source 42 and by adding a resistor coupled between the signal source 42 and the diode D7 similar to the resistor used in the Japanese patent provisional publication no. 57188133 described above; however, such an arrangement leads to increased power dissipation in the base drive circuit.

As should be evident from the foregoing, the transistors Q1 and Q2 are operated in saturation over a wide range of load current magnitudes, and hence the transistors Q1 and Q2 dissipate relatively little power during steady state operation. Also, use of the transistor Q3 can reduce the power required to turn on the transistors Q1 and Q2, leading to a further reduction in power dissipation.

The power dissipation in the switches Q1 and Q2 at turn-on and turn-off can be reduced by coupling the drive signals from the signal source 42 through a capacitor, in turn causing the base currents to have high magnitude peaks at turn-on and turn-off. Typically, the transistor Q3 is faster than the transistors Q1 and Q2 and will turn-on rapidly enough to assist in turn-on of the driver and driven transistors Q1 and Q2. This, in turn, further reduces losses in the power switches Q1 and Q2.

Figure 5:
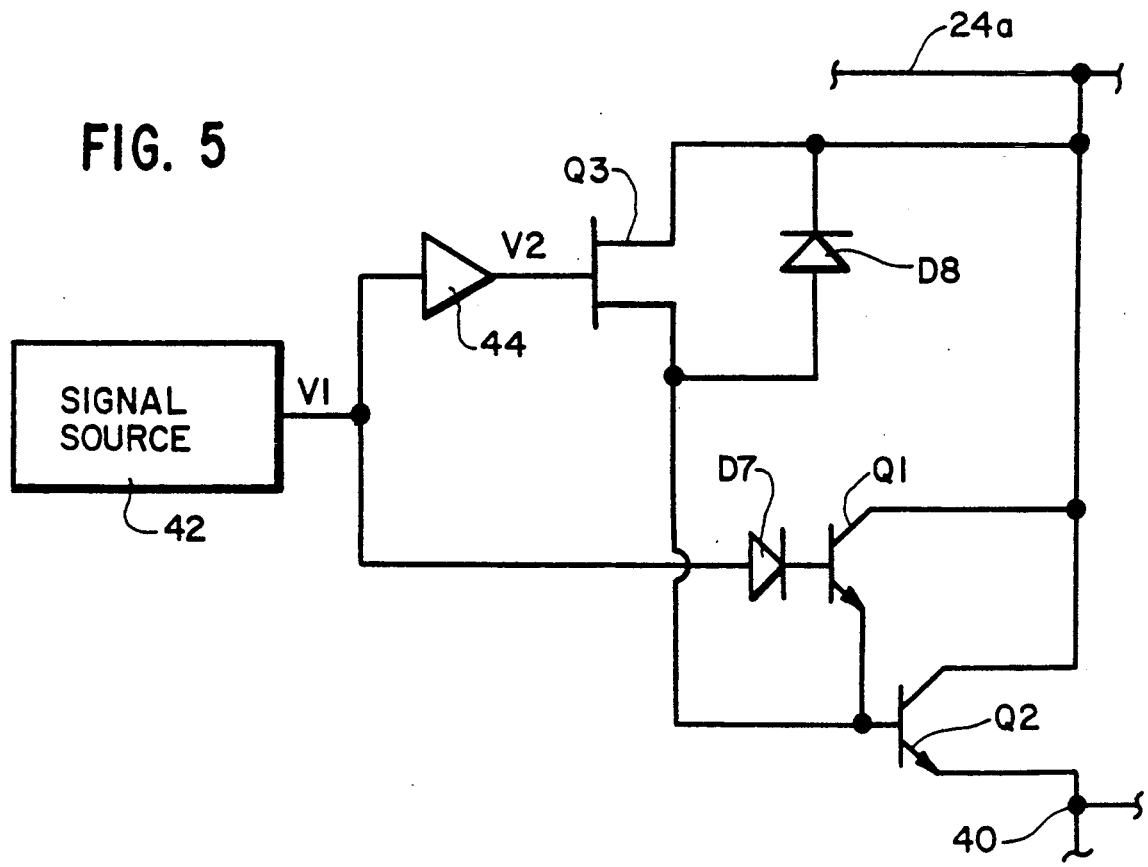
FIG. 5 comprises a combined block and schematic diagram of a further embodiment of the power switch according to the present invention.

FIG. 5 illustrates a modification to the power switch of FIG. 4 wherein identical elements are assigned like reference numerals. The embodiment of FIG. 5 differs from that of FIG. 4 in that the source of the transistor Q3 is coupled to the base of the driven transistor Q2, rather than to the diode D7 and the base of the transistor Q1. Such an arrangement permits the driven transistor Q2 to be turned on faster than in the embodiment of FIG. 4; however, a lower resistance FET is necessary for the transistor Q3.

By utilizing the Darlington-connected transistors too continuously supply load current, the magnitude of the base drive current which must be supplied thereto is reduced as compared to power switches utilizing a single output transistor.

We claim:

1. A power switch responsive to drive signals developed by a signal source, comprising:
   first and second transistors connected in a Darlington configuration each having a control electrode and first and second main current path electrodes wherein the first main current path electrodes of the first and second transistors are coupled together, the control electrode of the second transistor is coupled too the second main current path electrode of the first transistor and the control electrode of the first transistor is coupled to the signal source and receives the drive signals;
   a diode coupled between the signal source and the control electrode of the first transistor; and
   a MOSFET having a control electrode and first and second main current path electrodes wherein the first main current path electrode of the MOSFET is coupled to the first main current path electrodes of the first and second transistors, the second main current path electrode of the MOSFET is coupled to the control electrode of one of the first and second transistors and the control electrode of the MOSFET receives the drive signals.

2. A power switch responsive to drive signals developed by a signal source, comprising:
   first and second transistors connected in a Darlington configuration each having a control electrode and first and second main current path electrodes wherein the first main current path electrodes of the first and second transistors are coupled together, the control electrode of the second transistor is coupled to the second main current path electrode of the first transistor and the control electrode of the first transistor is coupled to the signal source and receives the drive signals;
   a diode coupled between the signal source and the control electrode of the first transistor;
   a MOSFET having a control electrode and first and second main current path electrodes wherein the first main current path electrode of the MOSFET is coupled to the first main current path electrodes of the first and second transistors, the second main current path electrode of the MOSFET is coupled to the control electrode of one of the first and second transistors and the control electrode of the MOSFET receives the drive signals; and
   a level shifter coupled between the signal source and the control electrode of the MOSFET.

3. A power switch responsive to drive signals developed by a signal source, comprising:
   first and second transistors connected in a Darlington configuration each having base, collector and emitter electrodes wherein the collector electrodes of the first and second transistors are coupled together and the base electrode of the second transistor is coupled to the emitter electrode of the first transistor;
   a MOSFET having gate, source and drain electrodes wherein the drain electrode is coupled to the collector electrodes of the first and second transistors and the source electrode is coupled to the base electrode of the second transistor; and
   a level shifter coupled between the signal source and the gate electrode of the MOSFET wherein level-shifted drive signals are provided to such gate electrode.

4. The power switch of claim 3, further including a diode coupled between the signal source and the base electrode of the first transistor.

* * * * *